United States Patent
Kim et al.

(10) Patent No.: US 8,017,490 B2
(45) Date of Patent: Sep. 13, 2011

(54) METHODS OF FORMING METAL-INSULATOR-METAL (MIM) CAPACITORS WITH PASSIVATION LAYERS ON DIELECTRIC LAYERS

(75) Inventors: Jong-Chae Kim, Gyeonggi-do (KR); Duk-Min Yi, Gyeonggi-do (KR); Sang-Il Jung, Seoul (KR); Jong-Wook Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/784,104

(22) Filed: May 20, 2010

(65) Prior Publication Data
US 2010/0224588 A1  Sep. 9, 2010

Related U.S. Application Data

(62) Division of application No. 11/413,282, filed on Apr. 28, 2006, now Pat. No. 7,749,852.

(30) Foreign Application Priority Data

Aug. 10, 2005  (KR) .................. 10-2005-0073498

(51) Int. Cl.
*H01L 21/20* (2006.01)
(52) U.S. Cl. ............... 438/381; 438/396; 257/E21.008
(58) Field of Classification Search .............. 438/381, 438/396
See application file for complete search history.

(56) References Cited

U.S. PATENT DOCUMENTS

| | | |
|---|---|---|
| 5,926,359 A | 7/1999 | Greco et al. |
| 6,180,976 B1 | 1/2001 | Roy |
| 6,746,914 B2 | 6/2004 | Kai et al. |
| 6,812,088 B1 | 11/2004 | Chen et al. |
| 6,822,283 B2 | 11/2004 | Lin et al. |
| 6,881,996 B2 | 4/2005 | Chen et al. |
| 2005/0077592 A1 | 4/2005 | Hsieh |
| 2005/0275005 A1 | 12/2005 | Choi et al. |

FOREIGN PATENT DOCUMENTS

| | | |
|---|---|---|
| JP | 03-241864 | 10/1991 |
| JP | 04-030568 | 2/1992 |
| JP | 06-334137 | 12/1994 |
| JP | 2004-193602 | 7/2004 |
| JP | 2005-129816 | 5/2005 |
| KR | 1020030096728 | 12/2003 |
| KR | 1020040086682 A | 10/2004 |
| KR | 1020050065008 A | 6/2005 |
| TW | 492022(B) | 6/2002 |
| TW | 558822 | 10/2003 |
| TW | 575942(B) | 2/2004 |

OTHER PUBLICATIONS

Search Report issued in Taiwan Application No. 095129020; Date of mailing Sep. 10, 2009.
Notice of Allowance issued in Taiwan Application No. 095129020; Date of mailing Oct. 20, 2009.

(Continued)

*Primary Examiner* — Alexander G Ghyka
(74) *Attorney, Agent, or Firm* — Myers Bigel Sibley & Sajovec, P.A.

(57) ABSTRACT

Methods of forming a dielectric layer of a MIM capacitor can include forming a passivation layer on a dielectric layer of a MIM capacitor to separate the dielectric layer from direct contact with an overlying photo-resist pattern. Related capacitor structures are also disclosed.

4 Claims, 5 Drawing Sheets

OTHER PUBLICATIONS

Chinese Office Action w/ English Translation, Application No. 200610128572.3, Date of mailing Jul. 27, 2007.

Korean Office Action, with English Translation, mailed Apr. 11, 2008, in corresponding Korean Patent Application 10-2005-0073498.

Korean Office Action, with English Translation, in corresponding Korean Paten Application 10-2006-10128572.3.

Korean Intellectual Property Office Notice of Decision to Grant Patent, mailed Aug. 25, 2008, in corresponding Korean Patent Application 10-2005-0073498.

METHODS OF FORMING METAL-INSULATOR-METAL (MIM) CAPACITORS WITH PASSIVATION LAYERS ON DIELECTRIC LAYERS

CROSS-REFERENCE TO RELATED APPLICATION

The present application is a Divisional application of U.S. patent application Ser. No. 11/413,282, filed in the United States Patent Office on Apr. 28, 2006 now U.S. Pat. No. 7,749,852, and claims the benefit of Korean Patent Application No. 10-2005-0073498, filed Aug. 10, 2005, the disclosure of which is hereby incorporated herein by reference in its entirety.

FIELD OF THE INVENTION

The present invention relates to methods of forming structures in integrated circuits, and more particularly, to methods of forming structures in integrated circuits using dual damascene processes.

BACKGROUND

As the density of integrated circuits has increased, there has been a need to reduce the size of associated capacitors in, for example, Dynamic Random Access Memories (DRAMs). However, there may also be a need to increase the per unit area capacitance of such capacitors, which may be difficult given that the overall size of the capacitors may be reduced for use in highly integrated circuits. One type of capacitor developed to address the above issues in the Metal-Insulator-Metal (MIM) type capacitor.

Figure 1:
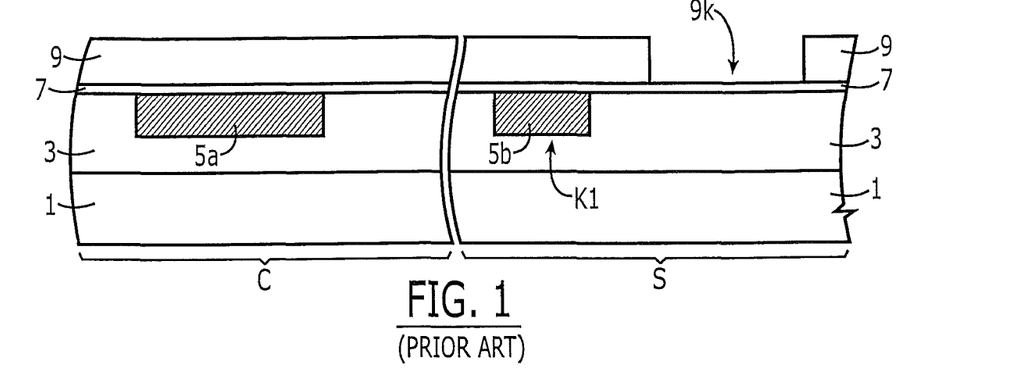
FIGS. 1-3 are cross sectional views illustrating conventional formation of a MIM type capacitor.
Figure 2:
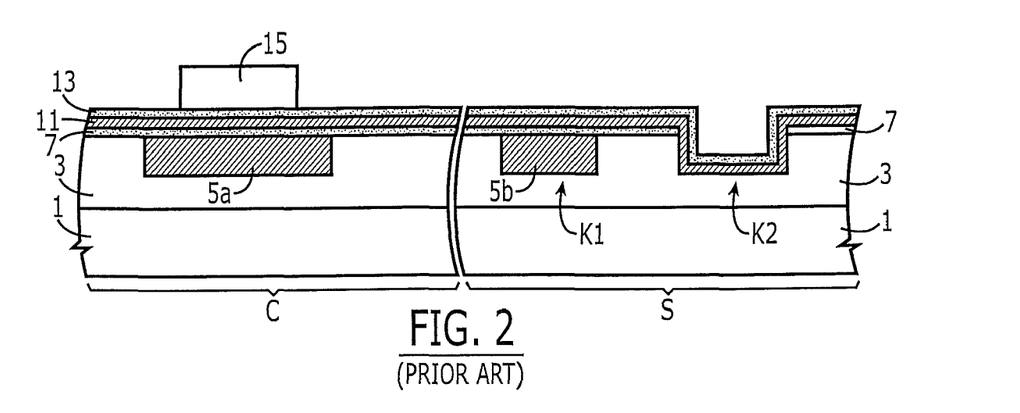
Figure 3:
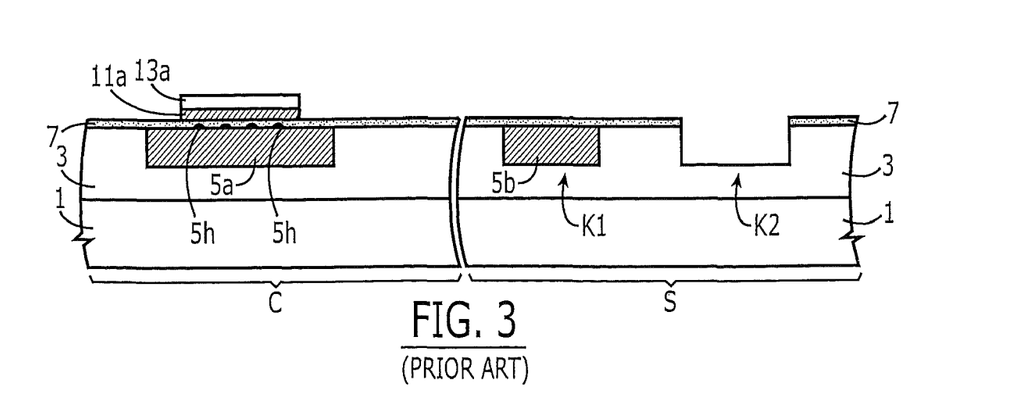

FIGS. 1-3 are cross sectional views illustrating a conventional method of fabricating a MIM capacitor. In particular, FIG. 1 shows a chip region (C) and a scribe region (S) of an integrated circuit substrate. According to FIG. 1, an interlayer dielectric (ILD) layer 3 is formed on the integrated circuit substrate in the chip and scribe regions. The ILD layer 3 includes a lower metal layer 5a in the chip region and a metal layer 5b in the scribe region. The lower metal layer 5a in the chip region can provide a lower electrode of the MIM capacitor, whereas the metal layer 5b in the scribe region can provide a first alignment key (K1). The lower metal layer 5a and the metal layer 5b can include copper.

A dielectric layer 7 is formed on the ILD layer 3 including on the lower metal layer 5a and on the metal layer 5b. A photo-resist material is formed on the dielectric layer 7 and patterned to provide a first photo-resist pattern 9 on the dielectric layer 7 including an opening 9k therein.

According to FIG. 2, a portion of the ILD layer 3 in the scribe region is etched using the first photo-resist pattern 9 to form a second alignment key (K2) in the scribe region. As further shown in FIG. 2, an upper metal layer 11 and a hard mask layer 13 are formed on the dielectric layer 7 and conformally in the second alignment key K2. A second photo-resist material is formed on the hard mask layer 13 and is patterned to provide a second photo-resist pattern 15.

According to FIG. 3, the second photo-resist pattern 15 is used to remove portions of the hard mask layer 13 and the upper metal layer 11 that are outside (i.e., not beneath) the second photo-resist pattern 15, thereby forming an upper metal electrode 11a and hard mask pattern 13a thereon to provide the MIM type capacitor structure as shown in FIG. 3.

MIM type capacitors are also discussed in, for example, U.S. Pat. No. 5,926,359, U.S. Pat. No. 6,180,976, and Korean patent application no. KR 2004-86682.

SUMMARY

Embodiments according to the present invention can provide methods of forming metal-insulator-metal (MIM) capacitors with passivation layers on dielectric layers and devices so formed. Pursuant to these embodiments, methods of forming a dielectric layer of a MIM capacitor can include forming a passivation layer on a dielectric layer of a MIM capacitor to separate the dielectric layer from direct contact with an overlying photo-resist pattern.

In some embodiments according to the invention, forming a passivation layer is preceded by forming an upper electrode on the dielectric layer. In some embodiments according to the invention, forming a passivation layer is further preceded by forming a capping insulation layer on the upper electrode beneath the passivation layer.

In some embodiments according to the invention, forming an upper electrode layer on the dielectric layer further includes forming a photo-resist pattern on the capping insulation layer to expose portions of the capping insulation layer and the upper electrode outside the photo-resist pattern. In some embodiments according to the invention, the method further includes removing the portions of the capping insulation layer and the upper electrode layer outside the photo-resist pattern to form an upper electrode for the MIM capacitor to expose a portion of the dielectric layer above a lower conductive plug of the MIM capacitor and removing the photo-resist pattern from the capping insulation layer.

In some embodiments according to the invention, forming a photo-resist pattern on the capping insulation layer includes forming the photo-resist pattern in a chip region of an integrated circuit substrate and in a scribe region of an integrated circuit substrate and removing portions of the capping insulation layer and the upper electrode layer outside the photo-resist pattern includes removing the portions of the capping insulation layer and the upper electrode layer outside the photo-resist pattern in the chip region and in the scribe region to form an alignment key in the scribe region.

In some embodiments according to the invention, the method further includes removing the portions of the capping insulation layer outside the photo-resist pattern to form a patterned capping insulation layer. The photo-resist pattern is removed from the capping insulation layer and the portions of the upper electrode outside the patterned capping insulation layer are removed to expose a portion of the dielectric layer above a lower conductive plug of the capacitor. In some embodiments according to the invention, the passivation layer is formed directly on the exposed portion of the dielectric layer.

In some embodiments according to the invention, forming a passivation layer on a dielectric layer of a MIM capacitor further includes forming the passivation layer directly on the dielectric layer at a portion of the capacitor directly above an interface between a lower conductive plug of the capacitor and a lower electrode of the capacitor and forming the passivation layer over an upper electrode and the dielectric layer at a portion of the capacitor that is off-set from the interface.

In some embodiments according to the invention, the method further includes forming a photo-resist pattern on the passivation layer that exposes portions of the passivation layer outside the photo-resist pattern on the passivation layer, removing the exposed portions of the passivation layer and underlying portions of the dielectric layer and a lower electrode of the capacitor to form the capacitor, wherein the lower electrode laterally extends beyond the upper electrode to contact an underlying conductive plug that is off-set from the upper electrode, forming a first Interlayer Dielectric (ILD) Layer on the capacitor, forming an etch stop layer on the ILD layer; forming a second Interlayer Dielectric (ILD) Layer on the etch stop layer, forming a recess in the first ILD layer, the etch stop layer, the second ILD layer, the passivation layer, and the capping insulation layer to expose the upper electrode, and forming an upper conductive interconnect in the recess using a dual damascene process.

In some embodiments according to the invention, a method of forming a metal-insulator-metal (MIM) capacitor includes forming a passivation layer directly on a dielectric layer of the MIM type capacitor and then forming an overlying photo-resist material directly on the passivation layer opposite the dielectric layer.

In some embodiments according to the invention, a method of forming a metal-insulator-metal (MIM) capacitor includes forming a copper interconnect layer in an interlayer dielectric layer (ILD), sequentially forming a lower electrode layer, a dielectric layer, an upper electrode layer on the copper interconnect, and a capping insulation layer thereon, forming a first photo-resist pattern on the capping insulation layer off-set from an interface between the lower electrode layer and the copper interconnect layer, using the first photo-resist material as an etch mask to remove portions of the upper electrode layer and capping insulation layer outside the photo-resist material to form an upper electrode beneath the photo-resist material and to expose a portion of the dielectric material directly above the interface, forming a passivation layer directly on the exposed dielectric material and on the upper electrode, and forming a second photo-resist material on the passivation layer covering the interface and the upper electrode.

In some embodiments according to the invention, a intermediate structure of a Metal-Insulator-Metal (MIM) capacitor includes a passivation layer on a dielectric layer of the MIM capacitor between the dielectric layer and an overlying photo-resist pattern. In some embodiments according to the invention, the passivation layer is directly on the dielectric layer. In some embodiments according to the invention, the passivation layer extends from directly above an interface between an underlying conductive plug and a lower electrode to beyond and above an edge of an upper electrode that is off-set from the interface.

In some embodiments according to the invention, a MIM capacitor includes a passivation layer directly on a dielectric layer of a MIM capacitor at a portion of the MIM capacitor directly above a lower conductive plug of the MIM capacitor and separated from the dielectric layer directly below the upper electrode of the MIM capacitor.

DESCRIPTION OF EMBODIMENTS ACCORDING TO THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be further understood that the term "outside" includes configuration where a portion of an underlying layer, such as a dielectric layer, is not covered by an overlying structure, such as a photo-resist pattern.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As described hereinbelow in greater detail, as appreciated by the present inventors, if a photo-resist pattern is allowed to directly contact a capacitor dielectric (such as in the arrangement shown at FIGS. 1-3), the photo-resist may contaminate the capacitor dielectric. Furthermore, as appreciated by the present inventors, if the lower electrode of the capacitor is formed to include hillocks, the hillocks may cause an increase in leakage current if cracks are formed in the dielectric layer (due to the hillocks). Therefore, in some embodiments according to the invention, a passivation layer is formed to separate a dielectric layer from a photo-resist pattern used to form the MIM capacitor. Accordingly, direct contact between the photo-resist and the dielectric layer may be avoided which may reduce the likelihood of the photo-resist contaminating the dielectric layer. In further embodiments according to the invention, the upper electrode of the MIM capacitor is formed offset from an interface between a lower conductive plug and a lower electrode. Offsetting the upper electrode from the interface can reduce leakage current (in the case that hillocks are formed) by forming the opposing faces of the upper and lower electrodes offset from the interface. Therefore, if hillocks in the lower conductive plug cause, for example, cracks in the dielectric layer directly above the interface, an increased leakage current may not be observed as the opposing faces of the upper and lower electrodes are formed away from (i.e., offset from) the interface.

Figure 4:
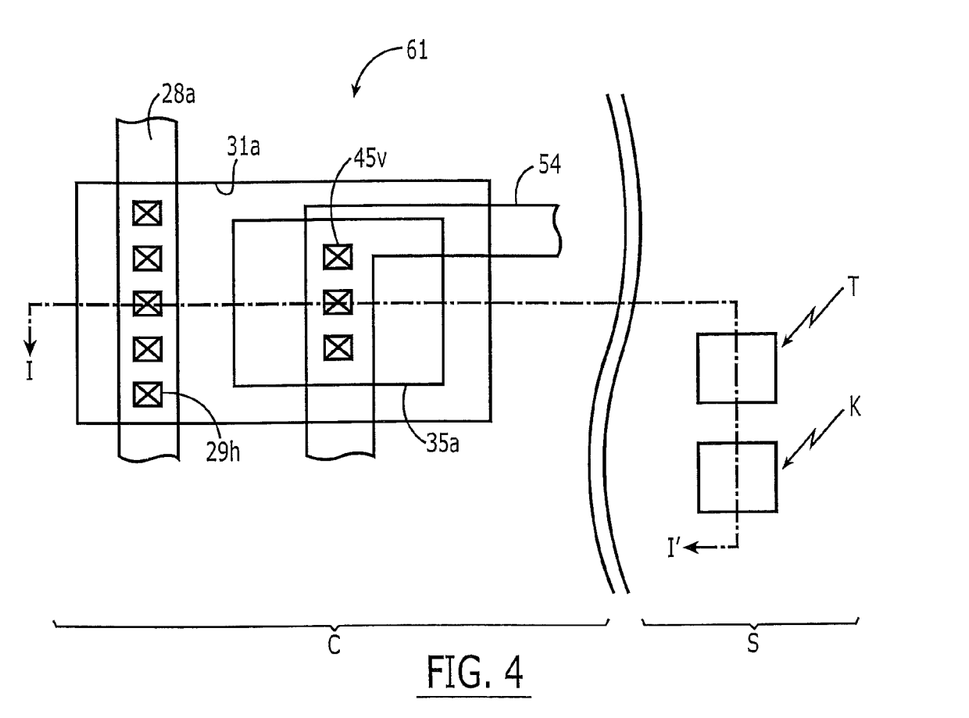
FIG. 4 is a plan view of a MIM capacitor according to some embodiments of the invention.

FIG. 4 is a plan view of a MIM capacitor 61 according to some embodiments of the invention. According to FIG. 4, the MIM capacitor 61 is formed in a chip region of an integrated circuit substrate. A trench (T) and an alignment key (K) are formed in a scribe region of the integrated circuit. The MIM capacitor 61 includes a lower conductive plug 28a and contacts 29h coupled to a lower conductive electrode 31a. An upper conductive electrode 35a is formed above the lower conductive electrode 31a beneath via holes 45v that are electrically coupled to an upper interconnect 54.

Figure 5:
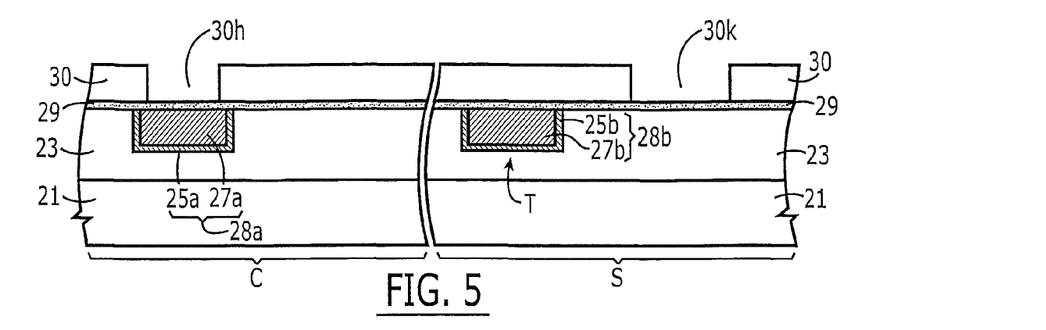
FIGS. 5-10 are cross sectional views that illustrate methods of forming MIM capacitors according to some embodiments of the invention.

As shown in FIG. 5, a lower interlayer dielectric (ILD) layer 23 is formed on a substrate 21 of an integrated circuit in both a chip region and scribe region thereof. A lower conductive plug 28a is formed in the ILD layer 23 of the chip region and a metal pattern 28b is formed in the ILD layer 23 in the scribe region. It will be understood that the lower conductive plug 28a can include a diffusion barrier layer 25a and a metal plug 27a to fill a recess in the ILD layer 23. It will be understood that the metal pattern 28b can include a diffusion barrier layer 25b and a metal plug 27b. It will further be understood that the conductive plug 28a can be formed using a damascene process. A lower capping insulation layer 29 is formed on the ILD including on the lower connective plug 28a and the metal pattern 28b in the scribe region.

As further shown in FIG. 5, a first photo-resist material is formed on the capping insulation layer 29 in both the chip and scribe regions of the integrated circuit. The first photo-resist material is patterned to form a first photo-resist pattern 30 having a first opening 30h above the lower conductive plug 28a in the chip region and a second opening 30k in the scribe region.

Figure 6:
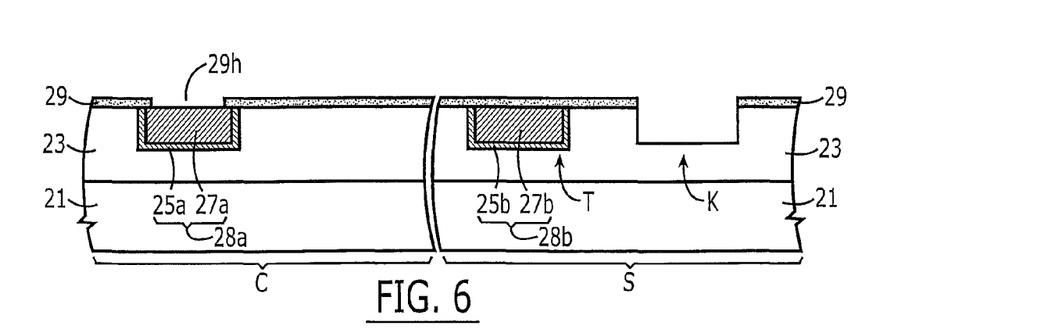

According to FIG. 6, portions of the lower capping insulation layer 29 are removed through the first and second openings 30h and 30k whereupon the first photo-resist pattern 30 may be removed from the lower capping insulation layer 29. As shown in FIG. 6, in the chip region, the lower capping insulation layer 29 is removed to expose a surface of the conductive plug 28a in the chip region whereas the portion of the capping insulation layer 29 and an underlying portion of the ILD layer 23 are removed in the scribe region to create a recess K therein.

Figure 7:
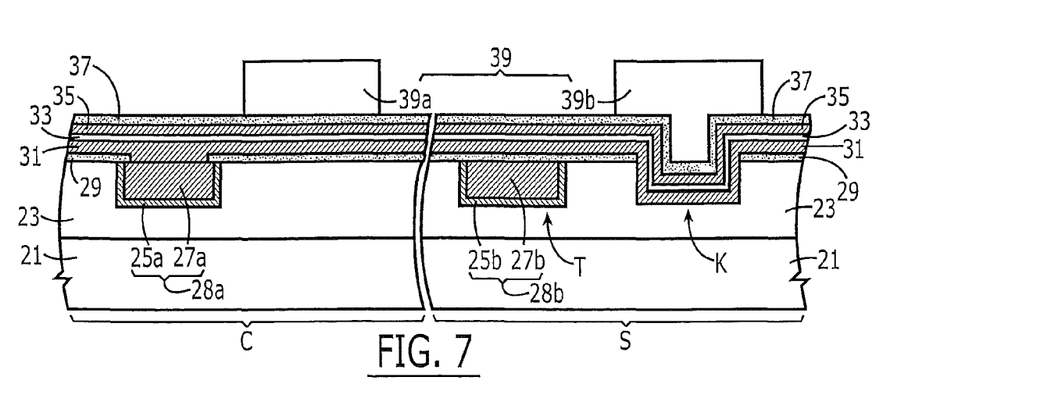

According to FIG. 7, a lower metal layer 31, a capacitor dielectric layer 33, and an upper metal layer 35 are sequentially formed on the lower capping insulation layer 29 on the conductive plug 28a in the chip region and in the recess K in the scribe region. It will be understood that the lower metal layer 31 can be titanium nitride (TiN), tantalum nitride (TaN) or the like. It will be further understood that the capacitor dielectric layer 33 can be, for example, silicon nitride (SiN), ONO, a high K dielectric material, or the like. It will be further understood that the upper metal layer 35 can be a metal nitride layer, such as, TiN, TaN, or the like.

As further shown in FIG. 7, an upper capping insulation layer 37 is formed on the upper metal layer 35 in the chip and scribe region. It will be understood that the upper capping insulation layer 37 can be a material chosen to have high etch selectivity relative to the upper metal layer 35, such as silicon nitride. A second photo-resist material is formed on the upper capping insulation layer 37 and is patterned to create a second photo-resist pattern 39 including a portion 39a in the chip region and a portion 39b in the scribe region.

As shown in FIG. 7, the portion of the second photo-resist pattern 39a is offset from an interface between the conductive plug 28a and the lower metal layer 31. Accordingly, if hillocks are formed at the interface between the conductive plug 28 and the lower metal layer 31, cracks in the dielectric layer 33 may not affect leakage current to the extent shown in the prior art as surfaces of the lower and upper metal layers 31, 35 (which subsequently are formed to provide lower and upper metal electrodes) are offset from the interface thereby separating the electrodes of the capacitor from the portions of the dielectric layer 33 which may be subject to cracking.

Figure 8:
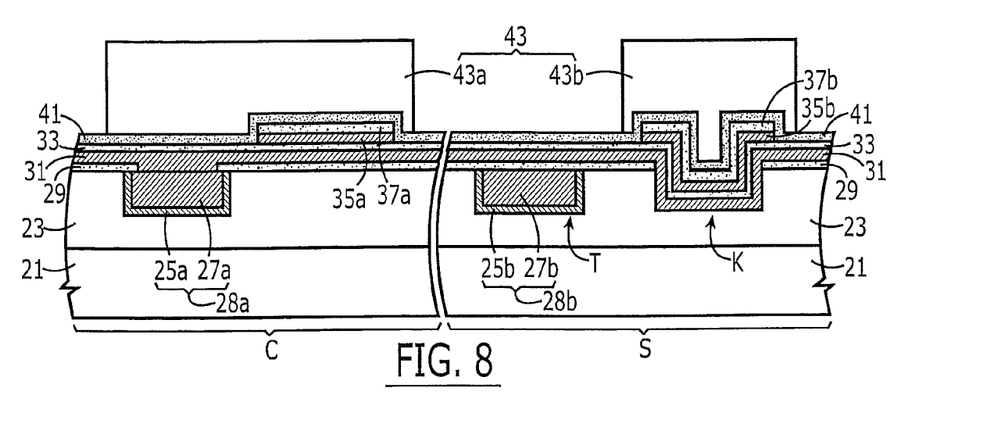

Referring to FIG. 8, in some embodiments according to the invention, portions of the upper capping insulation layer 37 and the underlying portions of the upper metal layer 35 located outside the second photo-resist pattern 39a (i.e., not directly beneath the second photo-resist pattern 39) are removed to expose the surface of the dielectric layer 33 that is outside the second photo-resist pattern 39a in the chip region. Similarly, portions of the upper capping insulation layer 37 and the underlying upper metal layer 35 outside the second photo-resist pattern 39a are removed to expose a surface of the dielectric layer 33 outside the second photo-resist pattern 39b in the scribe region. The second photo-resist pattern 39 may then be removed.

In other embodiments according to the invention, the second photo-resist pattern 39a is used as a mask to remove portions of the upper capping insulation layer 37 located outside the second photo-resist pattern 39 in both the chip region and the scribe region to thereby form first and second upper capping insulation patterns 37a and 37b, respectively. Thereafter, the second photo-resist pattern 39 may be removed whereupon the first and second upper capping insulation patterns 37a, 37b may be used to remove portions of the upper metal layer 35 outside the first and second upper capping insulation patterns 37a, 37b to form an upper metal electrode 35a in the chip region and upper alignment key 35b in the scribe region.

As further shown in FIG. 8, a passivation layer 41 is formed on the exposed portion of the dielectric layer 33 in the chip region and the scribe region, which extends from directly above the conductive plug 28a to and over the upper metal electrode 35a and the upper capping insulation pattern 37a in the chip region. Likewise, the passivation layer 41 extends from directly above the metal pattern 28b in the scribe region conformingly on the second upper capping insulation pattern 37b and the upper alignment key 35b in the recess K of the scribe region.

Therefore, as shown in FIG. 8, the passivation layer 41 may separate the underlying dielectric layer 33 from direct contact with a subsequently formed photo-resist pattern thereon to thereby reduce the potential for contamination of the dielectric by the photo-resist pattern. The passivation layer 41 may also reduce the leakage current between the upper and lower metal electrodes which may be caused by etch damage to the sides of upper metal electrode and the capacitor dielectric. In some embodiments according to the invention, the passivation layer 41 is a silicon nitride layer.

As further shown in FIG. 8, a third photo-resist material is formed on the passivation layer 41 and is patterned to form a third photo-resist pattern 43 including a lower electrode pattern 43a in the chip region and a lower alignment key pattern 43b in the scribe region.

Figure 9:
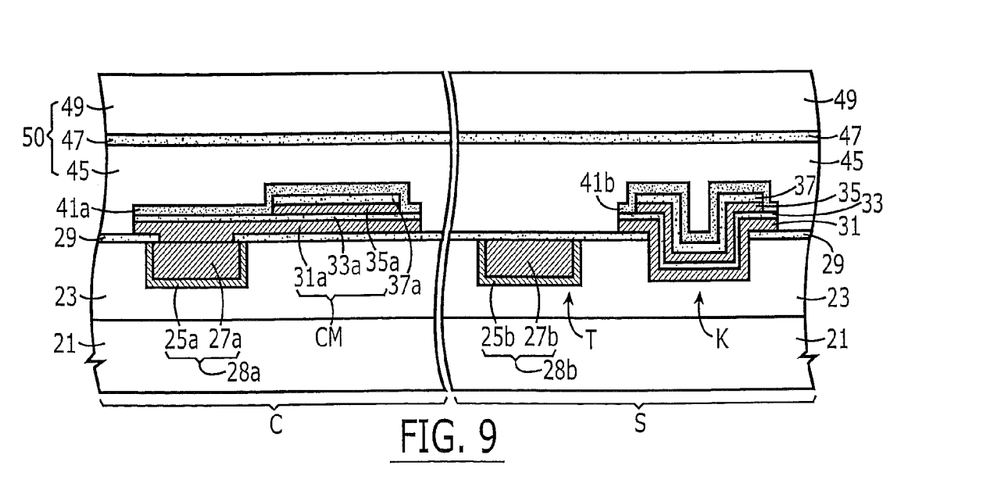

According to FIGS. 8-9, the third photo-resist pattern 43 is used to remove portions of the passivation layer 41, the dielectric layer 33, and the lower electrode 31 that are located outside the third photo-resist pattern 43A, thereby forming a MIM capacitor including the upper electrode 35a, dielectric layer 33a, and a lower electrode 31a. In some embodiments according to the invention, the opposing faces of the upper and lower electrodes are formed spaced apart from the interface between the conductive plug 28a and a portion of the lower electrode located directly above (and in direct contact therewith) the conductive plug 28a.

An upper ILD layer 50 including a first upper ILD layer 45, an etch stop layer 47, and a second upper ILD layer 49 are formed on the MIM capacitor in the chip region and on the alignment key K in the scribe region.

Figure 10:
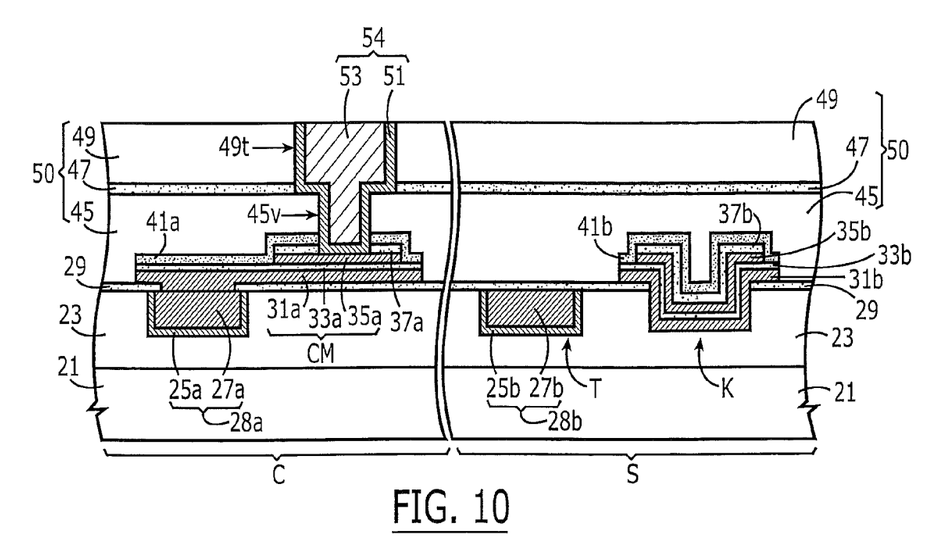

As shown in FIG. 10, a via hole 45v and a trench region 49t are formed through the upper ILD layer 50, the passivation layer 41a, and the upper capping insulation pattern 37a to expose a portion of the upper electrode 35a using, for example, a dual damascene process. In some embodiments according to the invention, the etch stop layer 47 may be eliminated if the formation of the trench region 49t can be adequately controlled otherwise using, for example, time controlled etching. An upper interconnect 54 is formed in the via hole 45v and trench region 49t, which can include an upper metal interconnect material 53 and an upper diffusion barrier layer 51 that lines the trench region 49t and the via hole 45v, thereby completing a MIM type capacitor structure according to some embodiments of the invention.

As described above, as appreciated by the present inventors, if a photo-resist pattern is allowed to directly contact a capacitor dielectric (such as in the arrangement shown at FIGS. 1-3), the photo-resist may contaminate the capacitor dielectric. Furthermore, as appreciated by the present inventors, if the lower electrode of the capacitor is formed to include hillocks, the hillocks may cause an increase in leakage current if cracks are formed in the dielectric layer (due to the hillocks). Therefore, in some embodiments according to the invention, a passivation layer is formed to separate a dielectric layer from a photo-resist pattern used to form the MIM capacitor. Accordingly, direct contact between the photo-resist and the dielectric layer may be avoided which may reduce the likelihood of the photo-resist contaminating the dielectric layer.

In further embodiments according to the invention, the upper electrode of the MIM capacitor is formed offset from an interface between a lower conductive plug and a lower electrode. Offsetting the upper electrode from the interface can reduce leakage current (in the case that hillocks are formed) by forming the opposing faces of the upper and lower electrodes offset from the interface. Therefore, if hillocks in the lower conductive plug cause, for example, cracks in the dielectric layer directly above the interface, an increased leakage current may not be observed as the opposing faces of the upper and lower electrodes are formed away from (i.e., offset from) the interface.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed:

1. A method of forming a metal-insulator-metal (MIM) capacitor comprising:
   forming a copper interconnect layer in an interlayer dielectric layer (ILD);
   sequentially forming a lower electrode layer, a dielectric material, an upper electrode layer on the copper interconnect, and a capping insulation layer thereon;
   forming a first photo-resist pattern on the capping insulation layer off-set from an interface between the lower electrode layer and the copper interconnect layer;
   using the first photo-resist pattern as an etch mask to remove portions of the upper electrode layer and capping insulation layer outside the first photo-resist pattern to form an upper electrode beneath the first photo-resist pattern and to expose a portion of the dielectric material above the interface;
   forming a passivation layer directly on the exposed dielectric material and on the upper electrode; and
   forming a second photo-resist pattern on the passivation layer covering the interface and the upper electrode.

2. A method according to claim 1 wherein forming a first photo-resist pattern on the capping insulation layer comprises forming the first photo-resist pattern in a chip region of an integrated circuit substrate and in a scribe region of an integrated circuit substrate; and
   wherein removing the portions of the capping insulation layer and the upper electrode layer outside the photo-resist pattern comprises removing the portions of the capping insulation layer and the upper electrode layer outside the first photo-resist pattern in the chip region and in the scribe region to form an alignment key in the scribe region.

3. A method according to claim 1 wherein forming a passivation layer directly on the exposed dielectric material further comprises:
   forming the passivation layer directly on the dielectric material at a portion of the capacitor directly above the interface; and forming the passivation layer over the upper electrode and the dielectric material at a portion of the capacitor that is off-set from the interface.

4. A method according to claim 3 further comprising wherein forming a second photo-resist pattern on the passivation layer comprises forming the second photo-resist pattern on the passivation layer that exposes portions of the passivation layer outside the second photo-resist pattern on the passivation layer;

removing the exposed portions of the passivation layer and underlying portions of the dielectric material to form a lower electrode of the capacitor, wherein the lower electrode laterally extends beyond the upper electrode to contact the copper interconnect that is off-set from the upper electrode;

forming a first upper ILD layer on the capacitor;

forming an etch stop layer on the first upper ILD layer;

forming a second upper ILD layer on the etch stop layer;

forming a recess in the first upper ILD layer, the etch stop layer, the second upper ILD layer, the passivation layer, and the capping insulation layer to expose the upper electrode; and forming an upper conductive interconnect in the recess using a dual damascene process.

\* \* \* \* \*